(12) United States Patent
Lai et al.

(10) Patent No.: US 9,958,779 B2
(45) Date of Patent: May 1, 2018

(54) PHOTORESIST ADDITIVE FOR OUTGASSING REDUCTION AND OUT-OF-BAND RADIATION ABSORPTION

(71) Applicant: Taiwan Semiconductor Manufacturing Company, Ltd., Hsin-Chu (TW)

(72) Inventors: Wei-Han Lai, New Taipei (TW); Ching-Yu Chang, Hsin-Chu (TW); Chien-Wei Wang, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days. days.

(21) Appl. No.: 14/876,879

(22) Filed: Oct. 7, 2015

(65) Prior Publication Data
US 2016/0238934 A1    Aug. 18, 2016

Related U.S. Application Data

(60) Provisional application No. 62/115,671, filed on Feb. 13, 2015.

(51) Int. Cl.
*G03F 7/004* (2006.01)
*G03F 7/11* (2006.01)
(Continued)

(52) U.S. Cl.
CPC .............. *G03F 7/091* (2013.01); *B05D 3/007* (2013.01); *C08F 18/04* (2013.01); *C08F 220/22* (2013.01);
(Continued)

(58) Field of Classification Search
CPC ...... G03F 7/004; G03F 7/0045; G03F 7/0046; G03F 7/2041; G03F 7/0392;
(Continued)

(56) References Cited

U.S. PATENT DOCUMENTS 8,216,767 B2    7/2012    Wang et al.
8,323,870 B2    12/2012    Lee et al.
(Continued)

FOREIGN PATENT DOCUMENTS

CN    1881085 A    12/2006
JP    2012517612 A    8/2012
(Continued)

OTHER PUBLICATIONS

Korean Application No. 10-2015-0176181, Office Action dated Sep. 29, 2016, 12 pgs.
(Continued)

*Primary Examiner* — Amanda C Walke
(74) *Attorney, Agent, or Firm* — Haynes and Boone, LLP

(57) ABSTRACT

A patternable layer is formed over a substrate. A photo-sensitive layer is formed over the patternable layer. The photo-sensitive layer contains an additive. The additive contains at least a floating control chemical and a volume control chemical. A spin drying or a baking process is performed to the photo-sensitive layer. The floating control chemical causes the additive to rise upward during the spin drying or baking process. Thereafter, as a part of an extreme ultraviolet (EUV) lithography process, the photo-sensitive layer is exposed. One or more outgassing chemicals are generated inside the photo-sensitive layer during the exposing. The volume control chemical is sufficiently voluminous and dense to trap the outgassing chemicals inside the photo-sensitive layer.

20 Claims, 11 Drawing Sheets

(51) Int. Cl.
| | |
|---|---|
| *G03F 7/09* | (2006.01) |
| *G03F 7/039* | (2006.01) |
| *G03F 7/20* | (2006.01) |
| *G03F 7/16* | (2006.01) |
| *H01L 21/027* | (2006.01) |
| *B05D 3/00* | (2006.01) |
| *H01L 21/033* | (2006.01) |
| *C08F 220/22* | (2006.01) |
| *C08F 18/04* | (2006.01) |

(52) U.S. Cl.
CPC .......... *G03F 7/0046* (2013.01); *G03F 7/0392* (2013.01); *G03F 7/0395* (2013.01); *G03F 7/0397* (2013.01); *G03F 7/11* (2013.01); *G03F 7/16* (2013.01); *G03F 7/2041* (2013.01); *H01L 21/0271* (2013.01); *H01L 21/0274* (2013.01); *H01L 21/0276* (2013.01); *H01L 21/033* (2013.01)

(58) Field of Classification Search
CPC ........ G03F 7/0395; G03F 7/0397; G03F 7/16; G03F 7/11; H01L 21/0275; H01L 21/0274; H01L 21/0276; H01L 21/033; B05D 3/007
USPC ...... 430/270.1, 271.1, 273.1, 322, 325, 330, 430/331, 329, 913, 394
See application file for complete search history.

(56) References Cited

U.S. PATENT DOCUMENTS

| | | | |
|---|---|---|---|
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2006/0246373 A1* | 11/2006 | Wang | G03F 7/0046 430/270.1 |
| 2009/0239176 A1* | 9/2009 | Kanda | G03F 7/0046 430/285.1 |
| 2010/0183975 A1* | 7/2010 | Takahashi | G03F 7/0045 430/270.1 |
| 2011/0027726 A1* | 2/2011 | Tsutsumi | C08G 61/02 430/325 |
| 2011/0143099 A1* | 6/2011 | Glodde | C07C 25/18 428/172 |
| 2011/0189609 A1* | 8/2011 | Kawabata | C07D 327/08 430/270.1 |
| 2011/0300483 A1* | 12/2011 | Cheng | G03F 7/0752 430/272.1 |
| 2012/0034558 A1* | 2/2012 | Chang | G03F 7/0046 430/270.1 |
| 2013/0059252 A1* | 3/2013 | Maruyama | G03F 7/091 430/296 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065544 A1* | 3/2014 | Hatakeyama | G03F 7/0397 430/285.1 |
| 2014/0065843 A1 | 3/2014 | Chang et al. | |
| 2014/0080064 A1* | 3/2014 | Hatakeyama | G03F 7/11 430/296 |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0248563 A1* | 9/2014 | Tanaka | C07C 69/734 430/296 |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0140490 A1* | 5/2015 | Wang | C08F 212/32 430/285.1 |

FOREIGN PATENT DOCUMENTS

| | | |
|---|---|---|
| KR | 10-2006-0114293 | 11/2006 |
| KR | 20130026992 A | 3/2013 |

OTHER PUBLICATIONS

Notice of Allowance for Korean Application No. 10-2015-0176181, dated Jun. 20, 2017, 7 pgs.

* cited by examiner

US 9,958,779 B2

PHOTORESIST ADDITIVE FOR OUTGASSING REDUCTION AND OUT-OF-BAND RADIATION ABSORPTION

PRIORITY DATA

This application claims priority to Provisional Patent Application No. 62/115,671, filed Feb. 13, 2015, and entitled "Novel Photoresist Additive for Outgassing Reduction and Out-of-Band Radiation Absorption," the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, EUV lithography still has some shortcomings related to outgassing from photoresist, which may contaminate lithography tools and degrade lithography performance.

Therefore, while existing photoresist materials have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
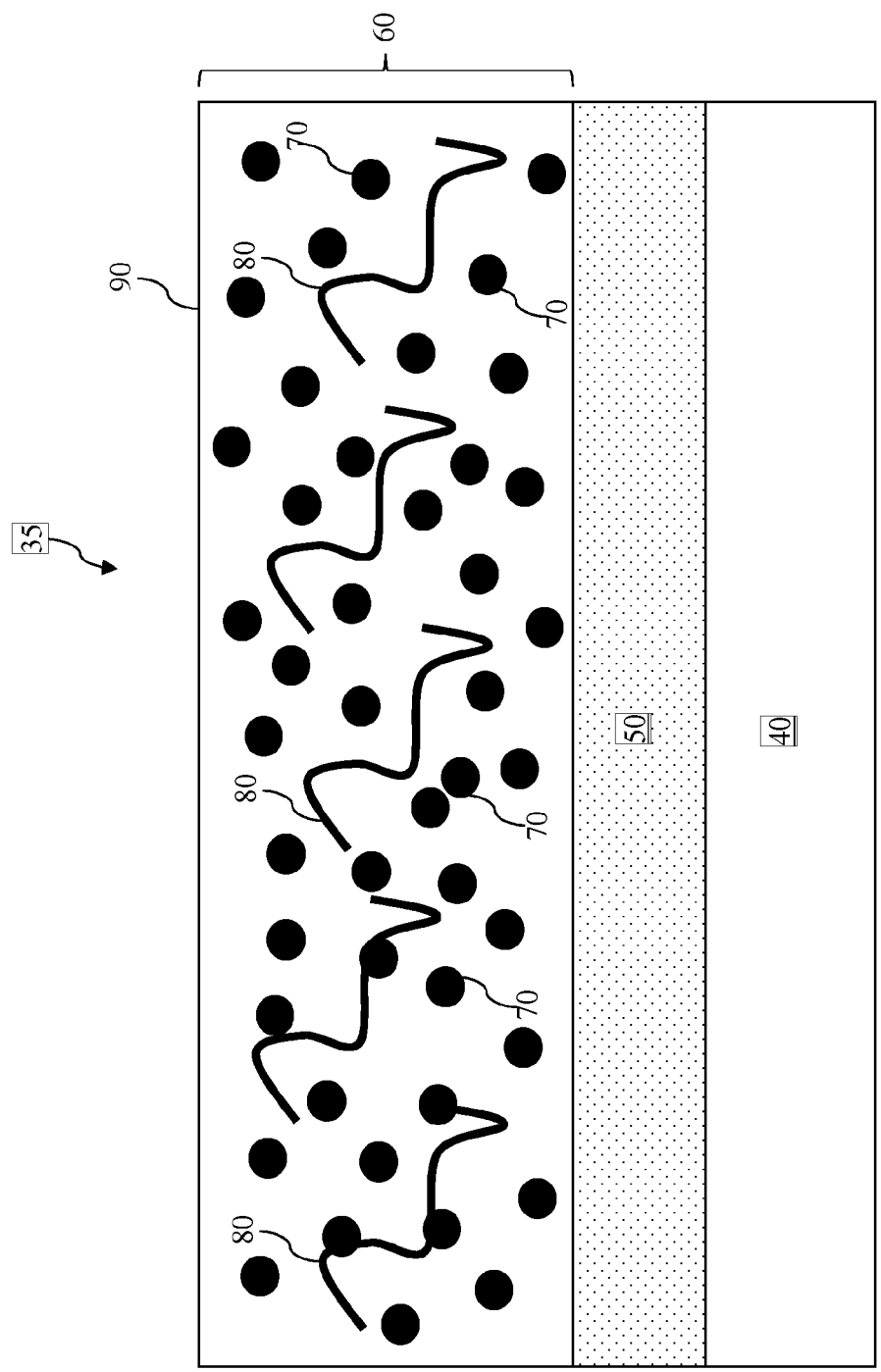
FIGS. 1 and 9-10 are diagrammatic cross-sectional side views of a semiconductor device at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 9:
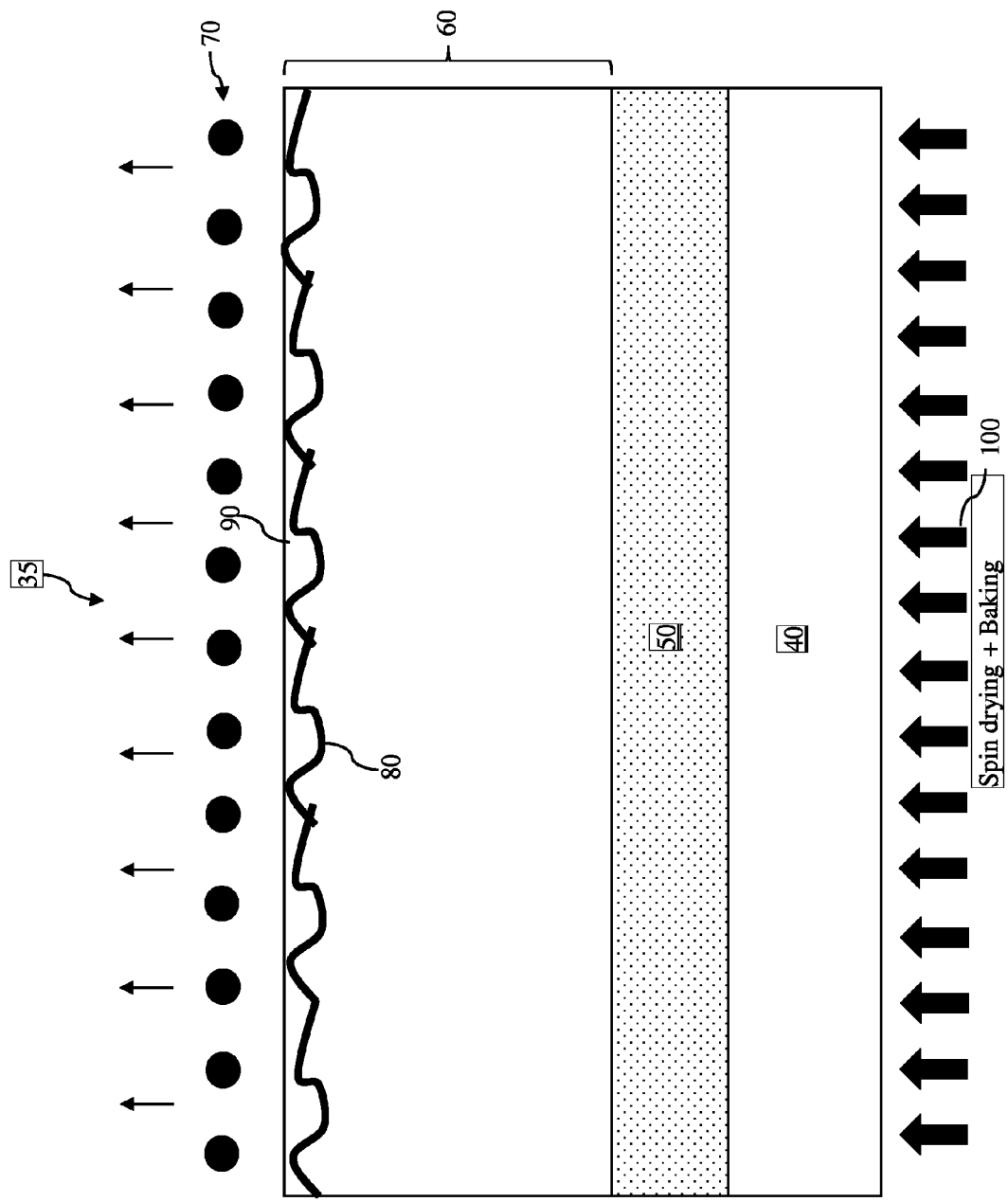
Figure 10:
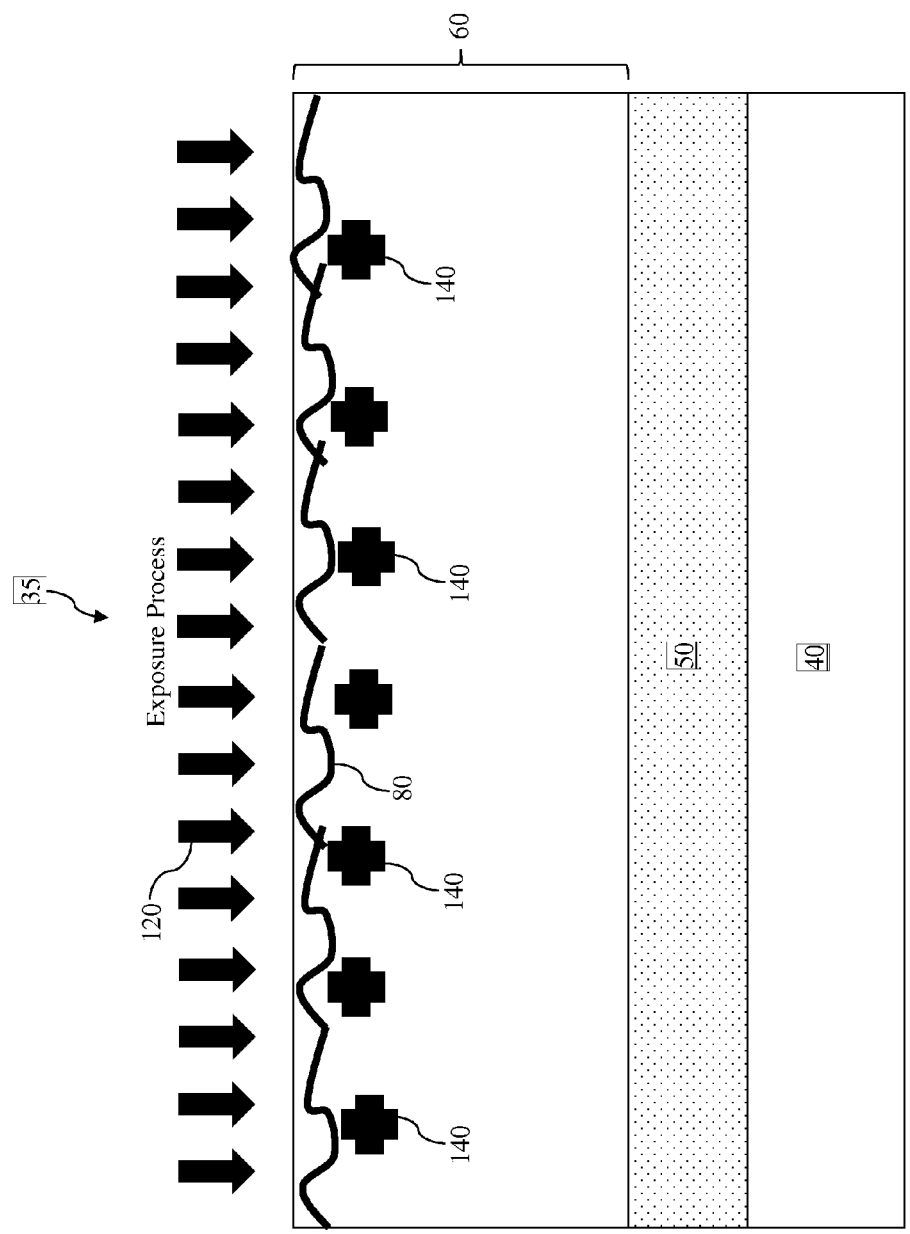

FIGS. 1 and 9-10 are diagrammatic fragmentary cross-sectional side views of a semiconductor device 35 at various stages of fabrication in accordance with various aspects of the present disclosure. The semiconductor device 35 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Extreme ultraviolet (EUV) lithography has become widely used due to its ability to achieve small semiconductor device sizes, for example for 20 nanometer (nm) technology nodes or smaller. However, photoresist outgassing still remains a challenge for conventional EUV lithography. In more detail, during (or after) an exposure process in EUV lithography, a photoresist material coated on a semiconductor wafer may produce outgassing products or species. When allowed to escape from the photoresist, the outgassing products may contaminate lithography tools and degrade lithography performance. Among other things, these outgassing products may be produced from the photo acid generator (PAG), photochemical cleavage of protecting groups, or decomposition products from the photo acid generator. As non-limiting examples, the PAG may outgas tertbutylbenzene during acid generation, and the polymer in the photoresist may outgas isobutene during the deprotection reaction.

To suppress the photoresist outgassing products, a protective layer may be formed over the photoresist surface. In this manner, the outgassing products can be blocked by the protective layer, thereby reducing the emission of the photoresist outgassing products. Unfortunately, this approach not only incurs higher fabrication costs (i.e., due to the extra material for the protective layer and the additional tools used to form it), but it may also negatively impact lithography performance, as it effectively increases the photoresist "height", thereby causing issues related to smaller process window, weak collapse margin, poor depth of focus, or resist film loss.

The present disclosure provides a novel approach to suppress photoresist outgassing but does not suffer from the drawbacks discussed above with the protective top coating approach. The various aspects of the present disclosure will be discussed below in greater detail with reference to FIGS. 1-11.

Referring to FIG. 1, a semiconductor device 35 includes a substrate 40. In some embodiments, the substrate 40 is a silicon substrate doped with a p-type dopant such as boron (for example a p-type substrate). Alternatively, the substrate 40 could be another suitable semiconductor material. For example, the substrate 40 may be a silicon substrate that is doped with an n-type dopant such as phosphorous or arsenic (an n-type substrate). The substrate 40 could include other elementary semiconductors such as germanium and diamond. The substrate 40 could optionally include a compound semiconductor and/or an alloy semiconductor. Further, the substrate 40 could include an epitaxial layer (epi layer), may be strained for performance enhancement, and may include a silicon-on-insulator (SOI) structure.

In some embodiments, the substrate 40 is substantially conductive or semi-conductive. The electrical resistance may be less than about $10^3$ ohm-meter. In some embodiments, the substrate 40 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 40 may contain Ti, Al, Co, Ru, TiN, WN2, or TaN.

In some other embodiments, the substrate 40 contains a dielectric material with a dielectric constant in a range from about 1 to about 40. In some other embodiments, the substrate 40 contains Si, metal oxide, or metal nitride, where the formula is MXb, wherein M is a metal or Si, and X is N or O, and wherein "b" is in a range from about 0.4 to 2.5. For example, the substrate 40 may contain $SiO_2$, silicon nitride, aluminum oxide, hafnium oxide, or lanthanum oxide.

A material layer 50 is formed over the substrate 40. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises at least one of different polymer structure, acid labile molecule, PAG (photo acid generator) loading, quencher loading, chromophore, cross linker, or solvent, which lead to different n value to photoresist. In some embodiments, the material layer 50 and photoresist have different etching resistance. In some embodiments, the material layer 50 contains an etching resistant molecule. The molecule includes low onishi number structure, double bond, triple bond, silicon, silicon nitride, Ti, TiN, Al, aluminum oxide, SiON, or combinations thereof.

It is understood that the substrate 40 and the material layer 50 may each include additional suitable material compositions in other embodiments.

A photoresist material 60 is formed over the material layer 50. In the embodiment shown in FIG. 1, the photoresist material 60 includes a positive photoresist, but it is understood that the photoresist material 60 may be a negative photoresist in alternative embodiments. The photoresist material 60 may be formed by a spin-coating process. The photoresist material 60 contains components such as a polymer, photo acid generators (PAG), quenchers, chromophore, surfactant, cross linker, etc. In an embodiment, the photo acid generator is bonded to the polymer. In a subsequent photolithography process, photons induce decomposition of the PAG. As a result, a small amount of acid is formed, which further induces a cascade of chemical transformations in the photoresist material 60. The photoresist material 60 may also optionally include a quencher that is disposed within the photoresist material 60 in order to improve critical dimension (CD) control.

According to the various aspects of the present disclosure, the photoresist material 60 also contains a solvent 70 and an additive 80. The additive 80 may be mixed in the solvent 70. In various embodiments, the solvent 70 may include Propylene Glycol Monomethyl Ether (PGME) or Propylene Glycol Monomethyl Ether Acetate (PGMEA). The additive 80 contains a floating control unit/component, a volume control unit/component, and optionally a radiation-absorption control unit/component. The functionalities and the chemical compositions of these control units of the additive 80 are now discussed in greater detail.

Figure 2:
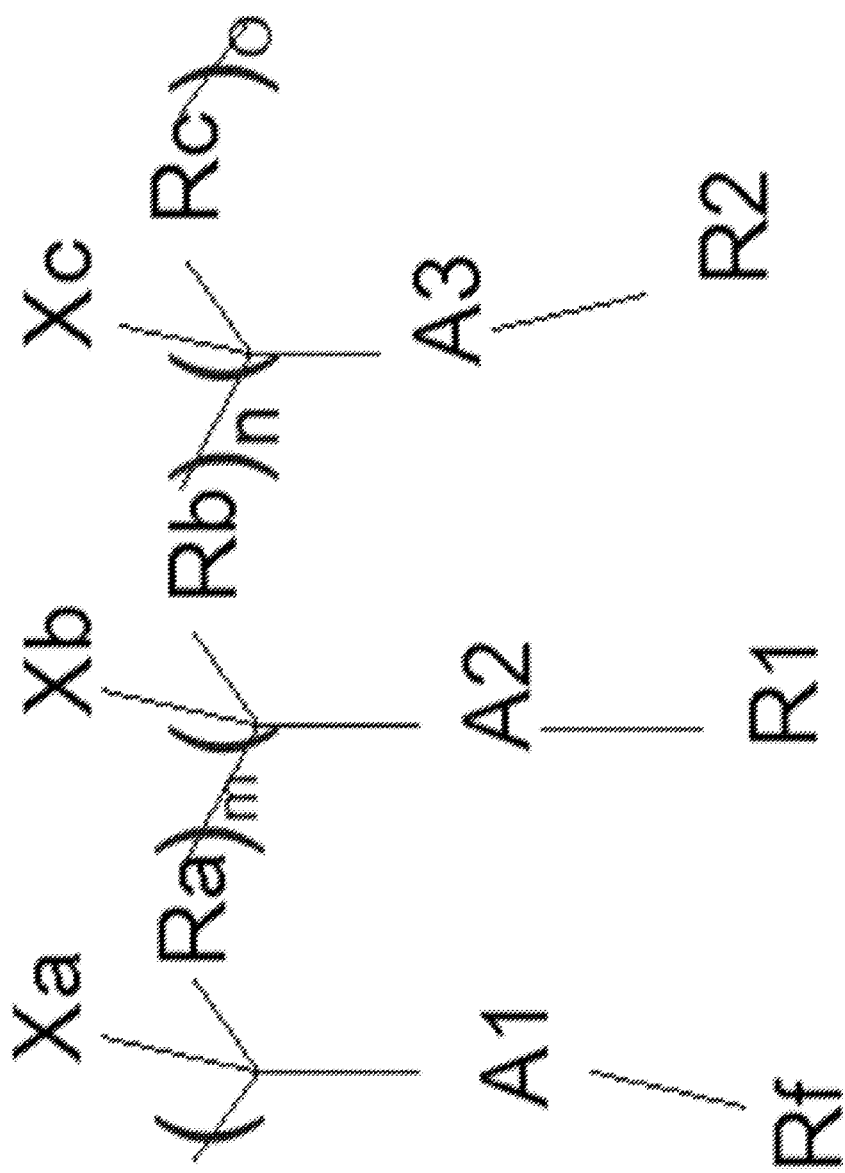
FIGS. 2-8 illustrate chemical formulas of a photoresist material (or components thereof) in accordance with some embodiments of the present disclosure.

Referring to FIG. 2, the additive 80 has the following chemical formula (or chemical structure) in some embodiments:

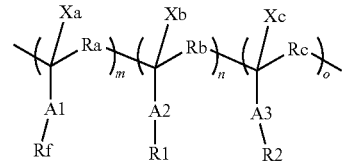

In the embodiment of the additive 80 illustrated above, Rf represents the floating control unit, R1 represents the volume control unit, and R2 represents the radiation-absorption control unit. In some embodiments, Xa, Xb, and Xc is each independently hydrogen (H), methyl, or fluorine. In other words, Xa may be H, methyl, or fluorine. Likewise, Xb or Xc may each be H, methyl, or fluorine as well. It is understood that Xa, Xb, or Xc may not necessarily be implemented as the same chemical though. For example, in some embodiments, Xa may be H, Xb may be methyl, and Xc may be fluorine. In other example embodiments, Xa may be methyl, Xb may be methyl, and Xc may be H. In yet other example embodiments, Xa may be H, Xb may be fluorine, and Xc may be H. Similarly, Ra, Rb, and Rc may independently represent a C0-C7 alkyl group or an aromatic group. In other words, Ra, Rb, and Rc may each be implemented as the C0-C7 alkyl group or as the aromatic group, and Ra, Rb, Rc need not necessarily be implemented as the same chemical. In some embodiments, m+n+o=1, 0.1<m<0.8, 0.2<n<0.8, and 0<=o<0.5. Lastly, A1, A2, and A3 may independently represent a COO— structure or a PhO— structure.

The floating control unit Rf is configured to cause the additive 80 to float (i.e., rise up) toward an upper surface 90 of the photoresist material 60, particularly as the photoresist material 60 undergoes a spin-drying process or a baking process (which will be performed subsequently as discussed below). The floating control unit Rf contains fluorine or a fluorine derivative, for example a C1-C9 fluorine-containing alkyl group. Fluorine reduces surface energy, thereby facilitating the floating of the additive 80 (toward the top surface 90) within the photoresist material 60. In some embodiments, the ratio (or concentration) of fluorine or fluorine derivative is between about 10% and about 80% in the additive 80. In other words, about 10%-80% of the additive 80 is the fluorine or the fluorine derivative.

Figure 3:
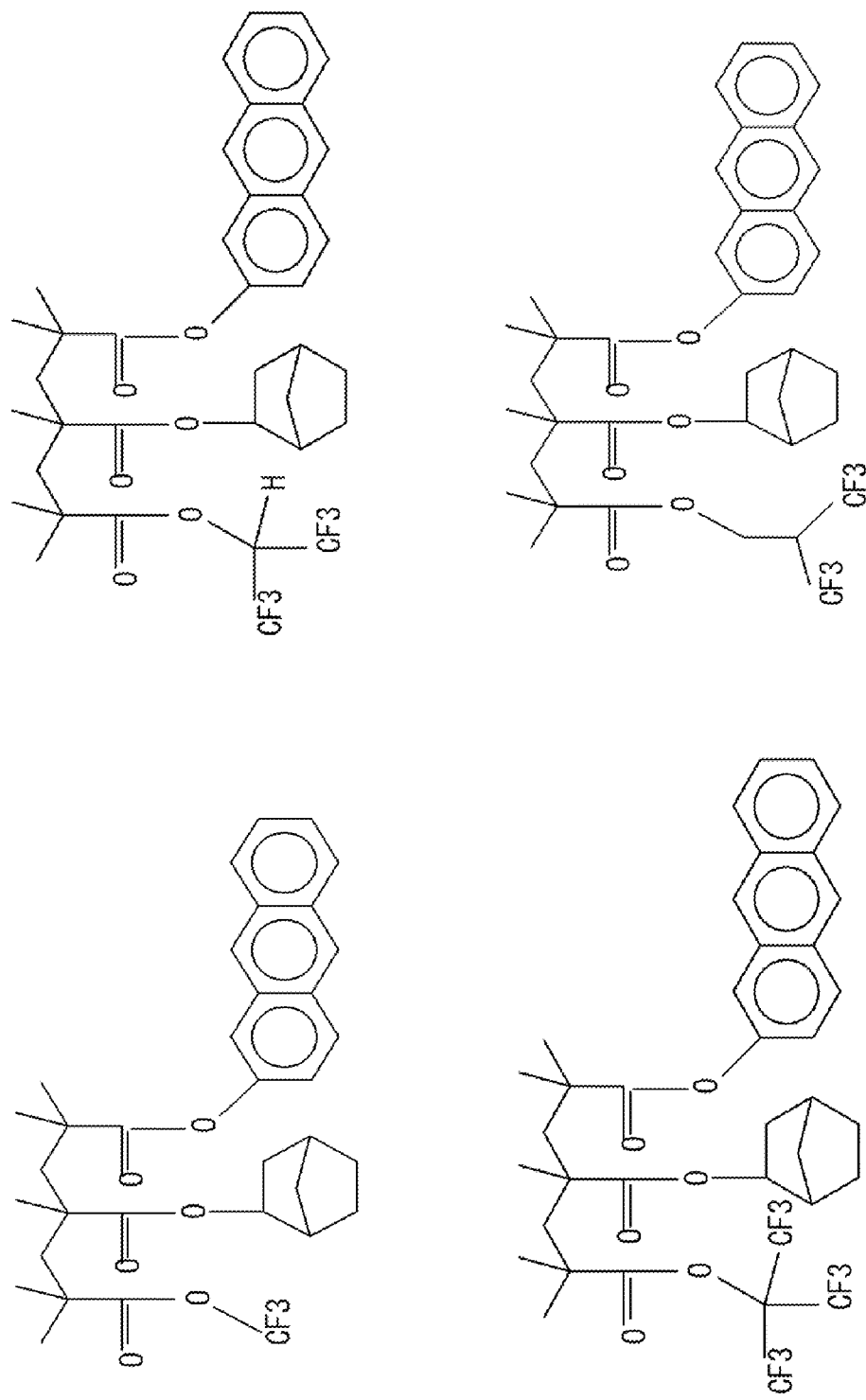

With reference to FIG. 3, the floating control unit Rf has one of the following chemical formulas when A1=COO— according to some embodiments:

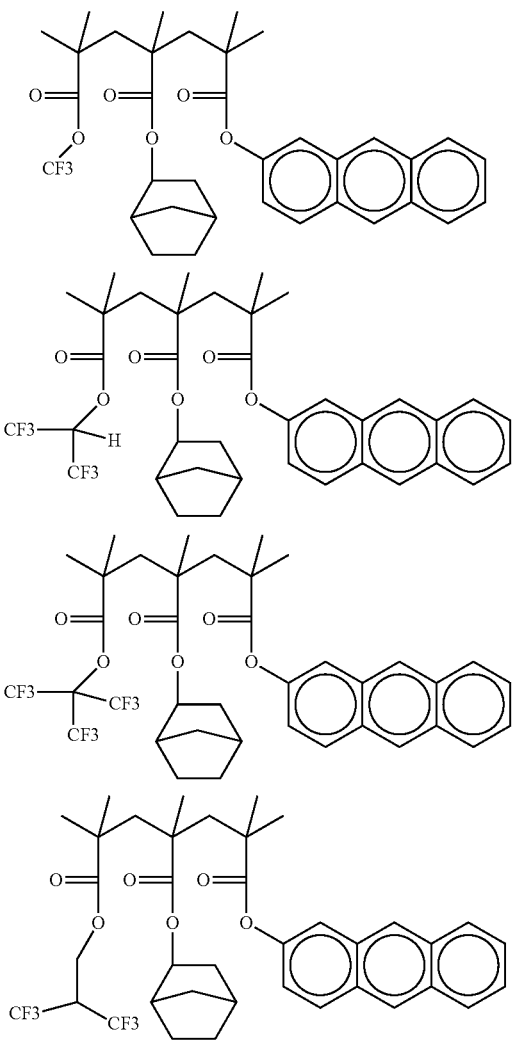

Figure 4:
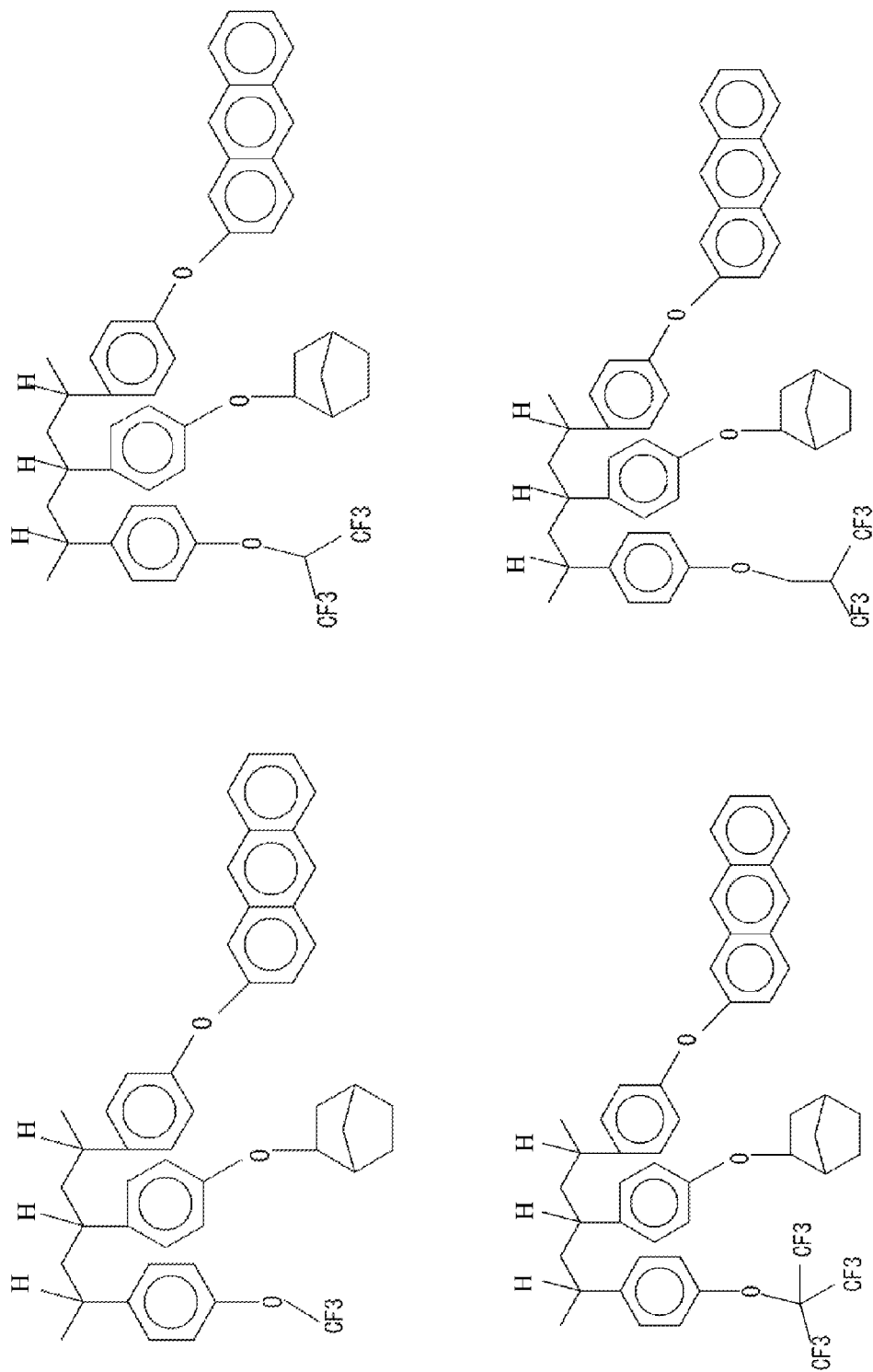

With reference to FIG. 4, the floating control unit Rf has one of the following chemical formulas when A1=PhO— according to some embodiments:

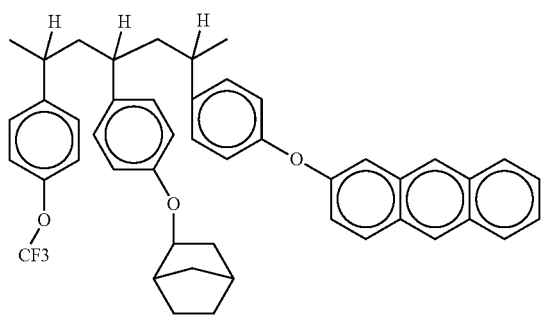

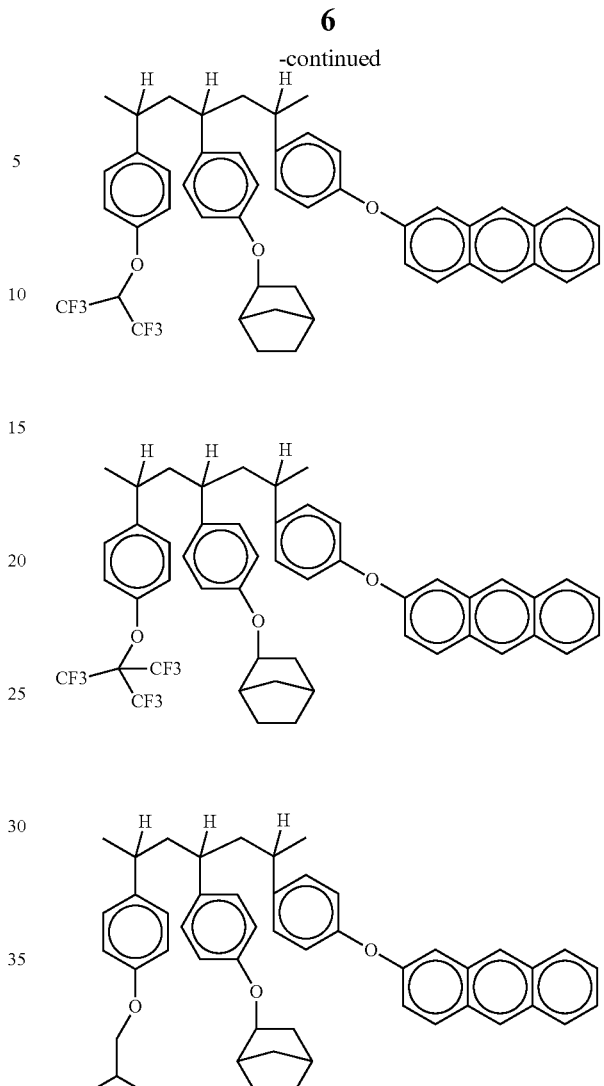

Figure 5:
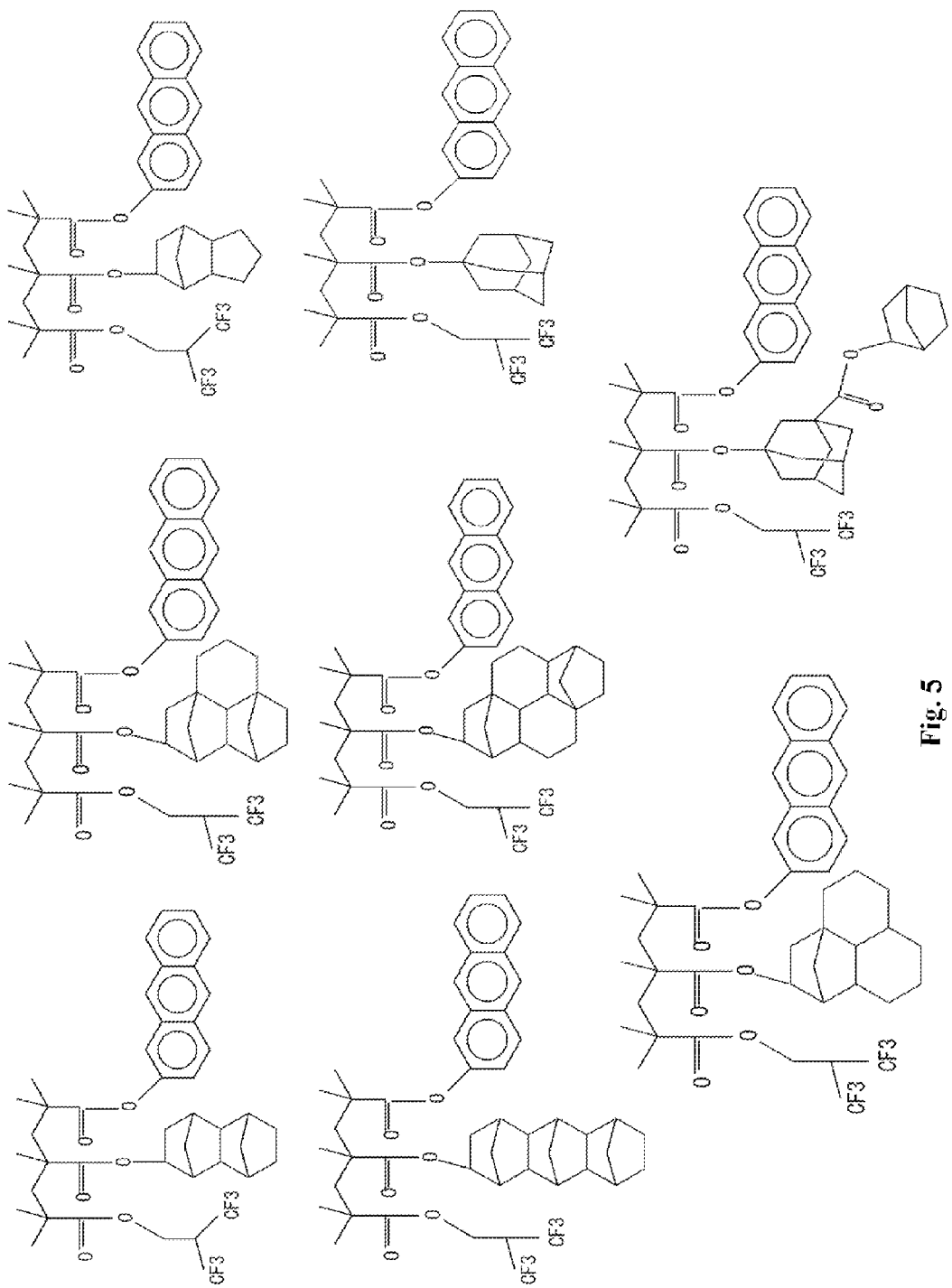
Figure 6:
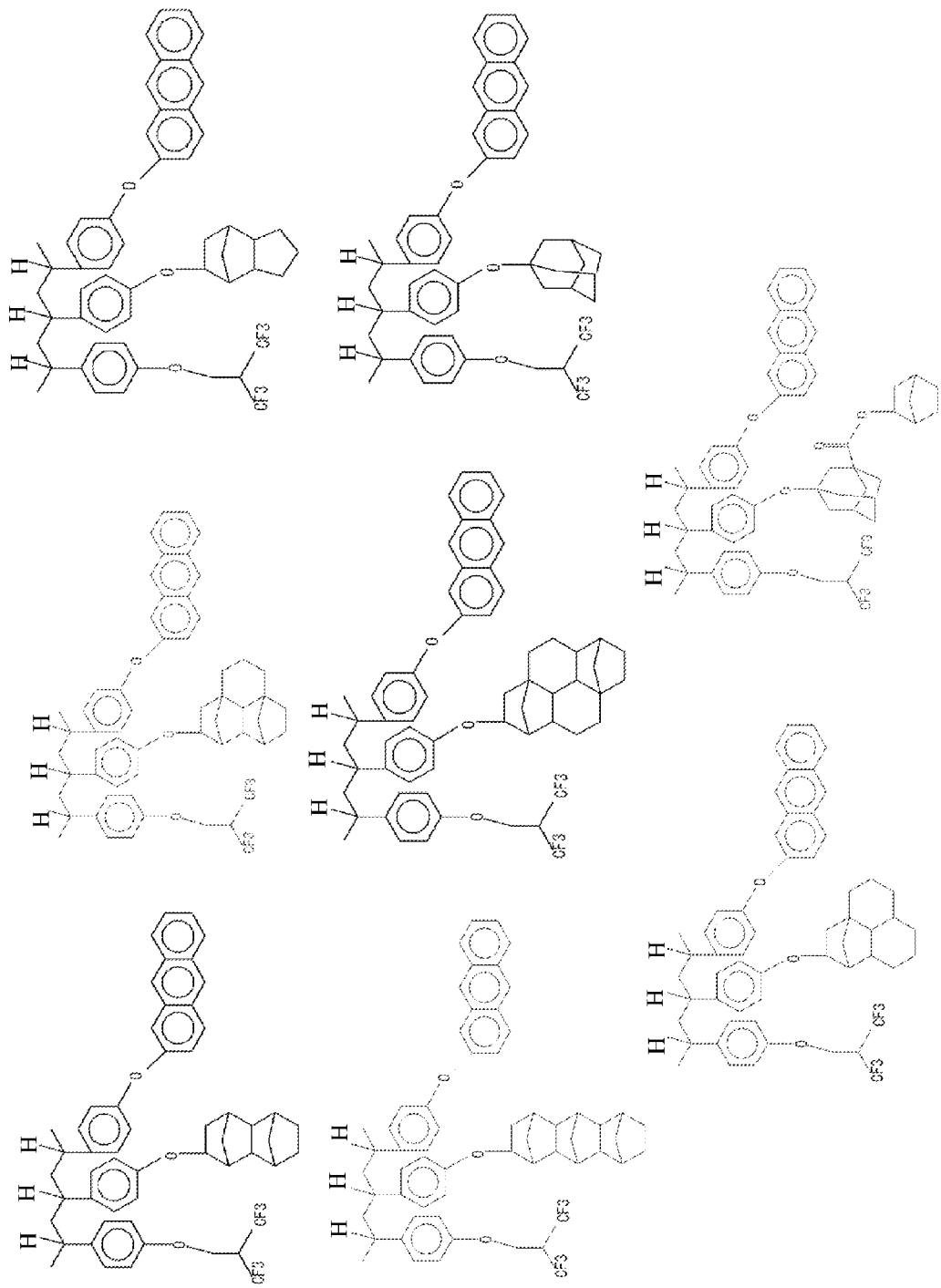

The volume control unit R1 (also referred to as a bulky unit) is configured to block the photoresist outgassing products discussed above. In other words, the material composition for the volume control unit R1 is sufficiently dense and voluminous such that it serves as a physical barrier for the photoresist outgassing products released during an exposure process (discussed below). Or alternatively stated, due to the presence of the volume control unit R1, the photoresist outgassing products cannot penetrate through the additive 80. In some embodiments, the volume control unit R1 causes the additive 80 to be denser (i.e., having a greater density) than the rest of the photoresist material 80. In some embodiments, the additive 80 has a molecular weight in a range from about 1000 to about 25000. In some embodiments, the volume control unit R1 contains C5-C20 alkyl group, cycloalkyl group, hydroxylalkyl group, alkoxy group, alkoxyl alkyl group, acetyl group, acetylalkyl group, carboxyl group, alky carboxyl group, cycloalkyl carboxyl group, C5-C20 saturated or unsaturated hydrocarbon ring, or C5-C20 heterocyclic group. In some embodiments, the volume control unit R1 may include a 2-dimensional ring structure and/or a 3-dimensional crisscross structure. In some embodiments, the ratio (or concentration) of the volume control unit R1 is between about 0% and about 50% in the additive 80. In other words, about 0%-50% of the additive 80 is the volume control unit R1.
With reference to FIG. 5, the volume control unit R1 has one of the following chemical formulas when A2=COO— according to some embodiments:
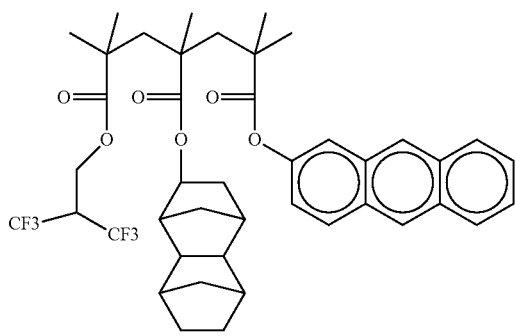
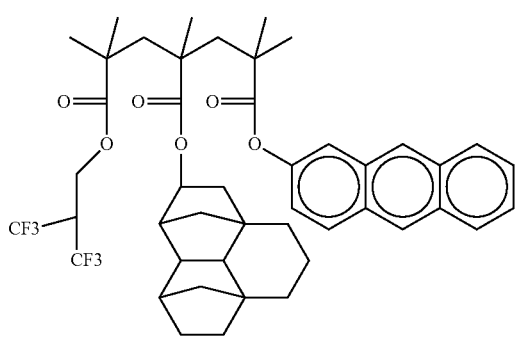
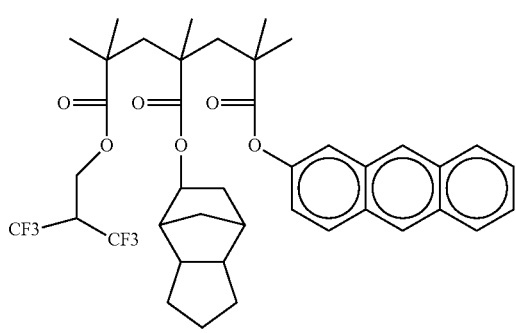
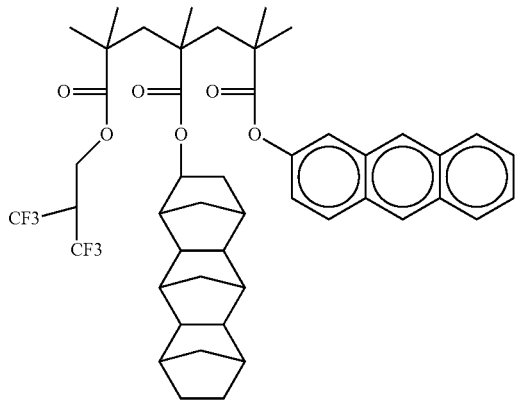
-continued
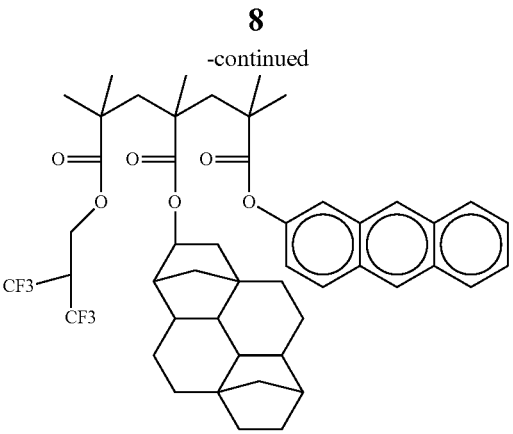
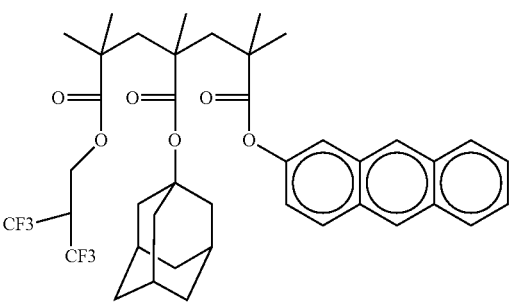
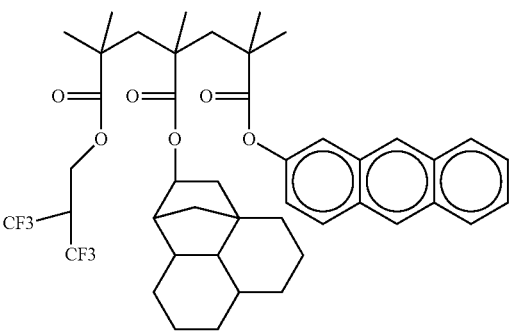
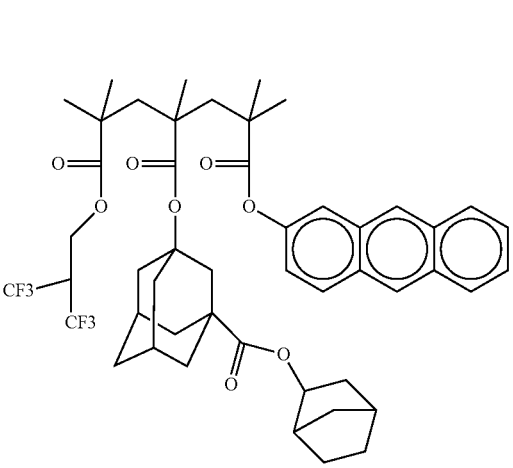
With reference to FIG. 6, the volume control unit R1 has one of the following chemical formulas when A2=PhO— according to some embodiments:

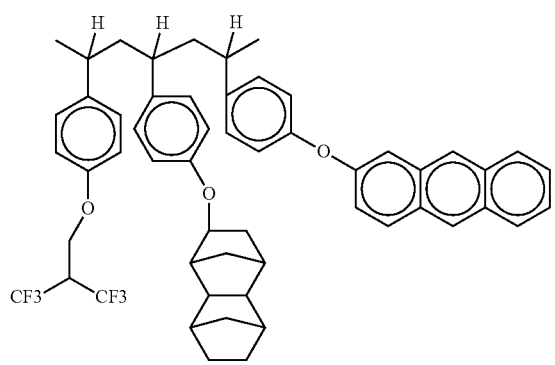

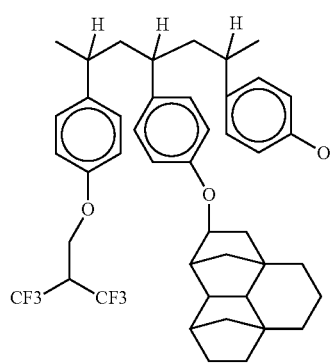

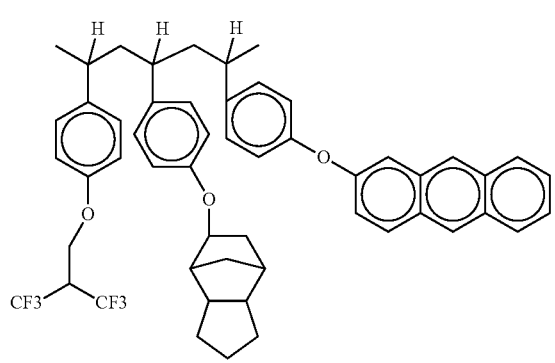

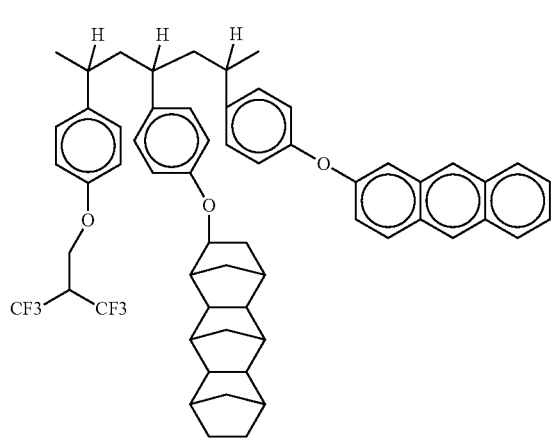

-continued

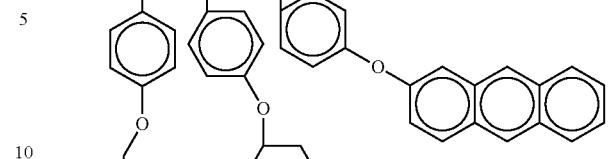

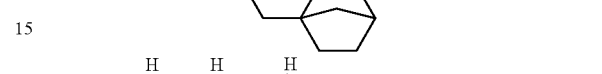

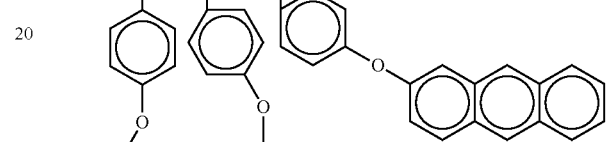

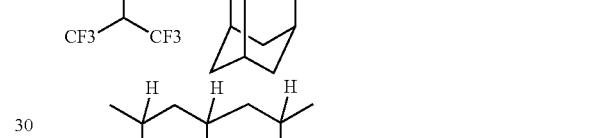

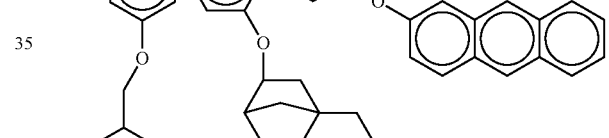

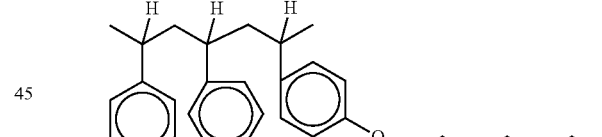

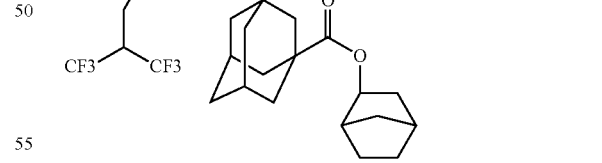

The radiation-absorption control unit R2 is configured to absorb out-of-band OOB) radiation for EUV lithography. For example, the radiation-absorption control unit R2 may be configured to absorb radiation having a wavelength in a range from about 180 nm to about 250 nm, which are considered OOB radiation for EUV lithography. In some embodiments, the radiation-absorption control unit R2 contains C5-C20 benzene, naphthalene, phenanthrene, or pentacenequinone derivatives. In some embodiments, the ratio (or concentration) of the radiation-absorption control unit R2 is between about 0% and about 50% in the additive 80. In other words, about 0%-50% of the additive 80 is the radiation-absorption control unit R2.

Figure 7:
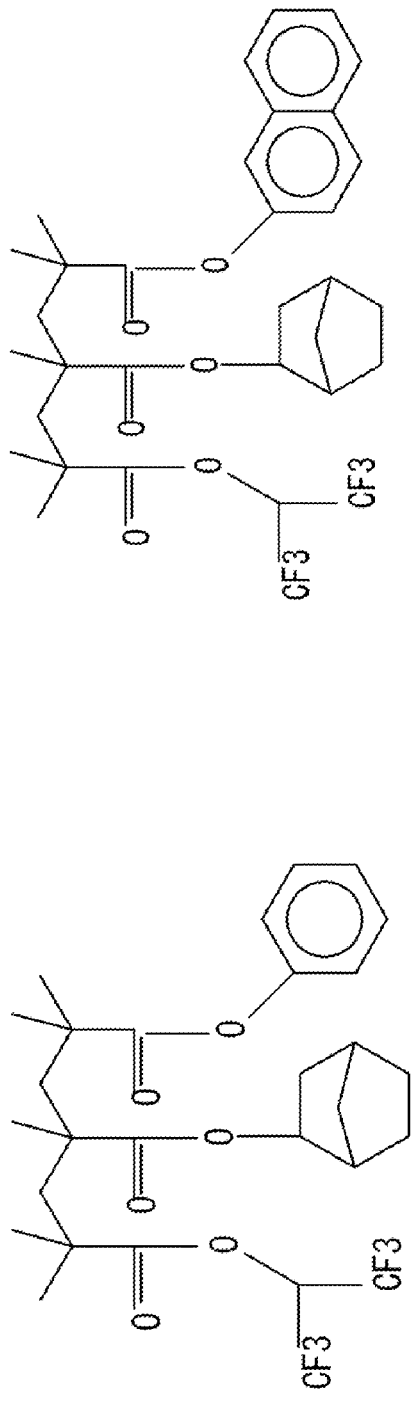
Figure 7:
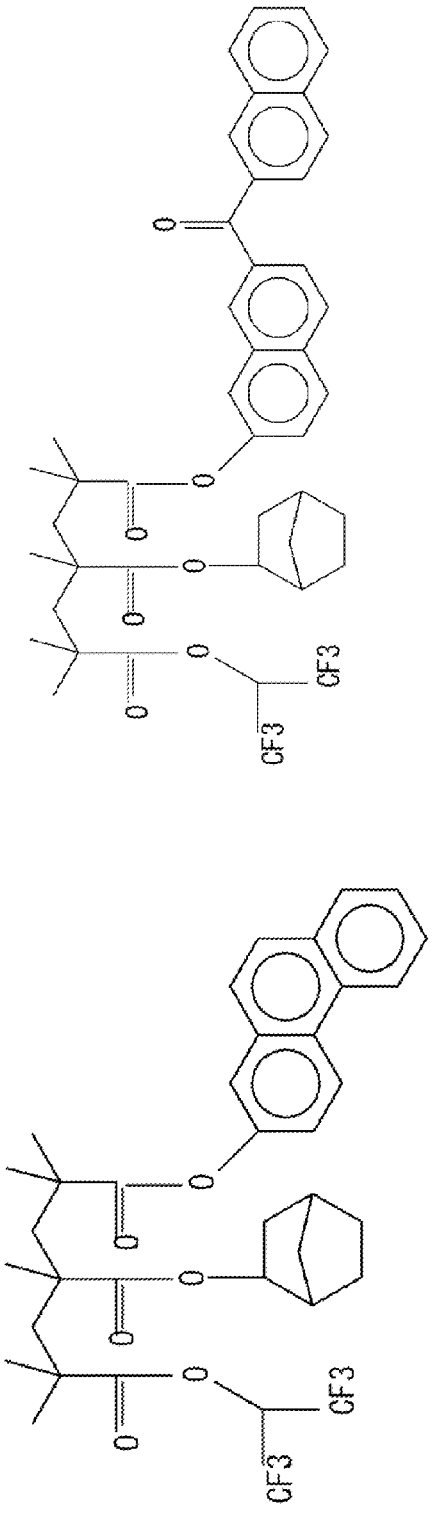

With reference to FIG. 7, the radiation-absorption control unit R2 has one of the following chemical formulas when A3=COO— according to some embodiments:

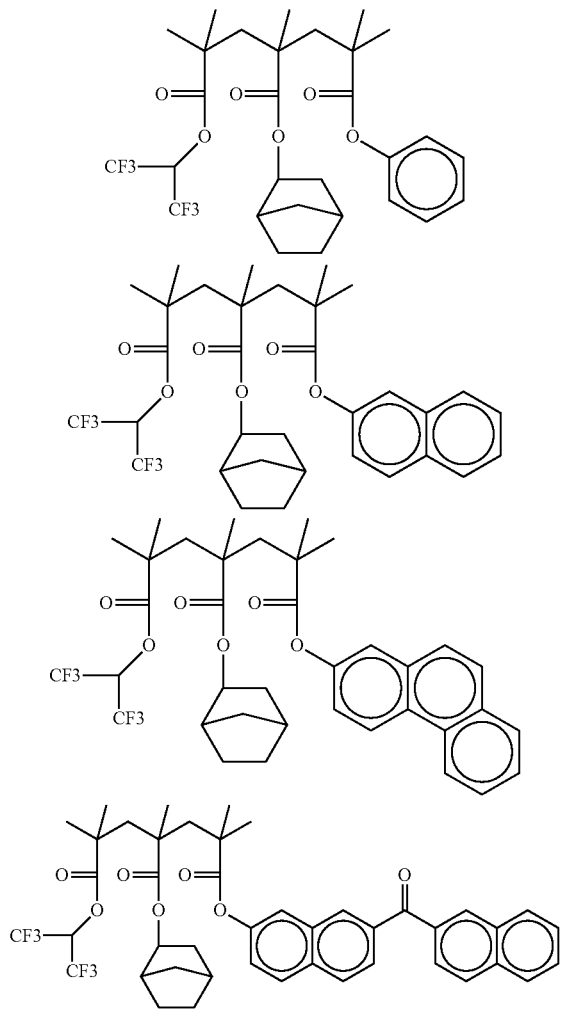

Figure 8:
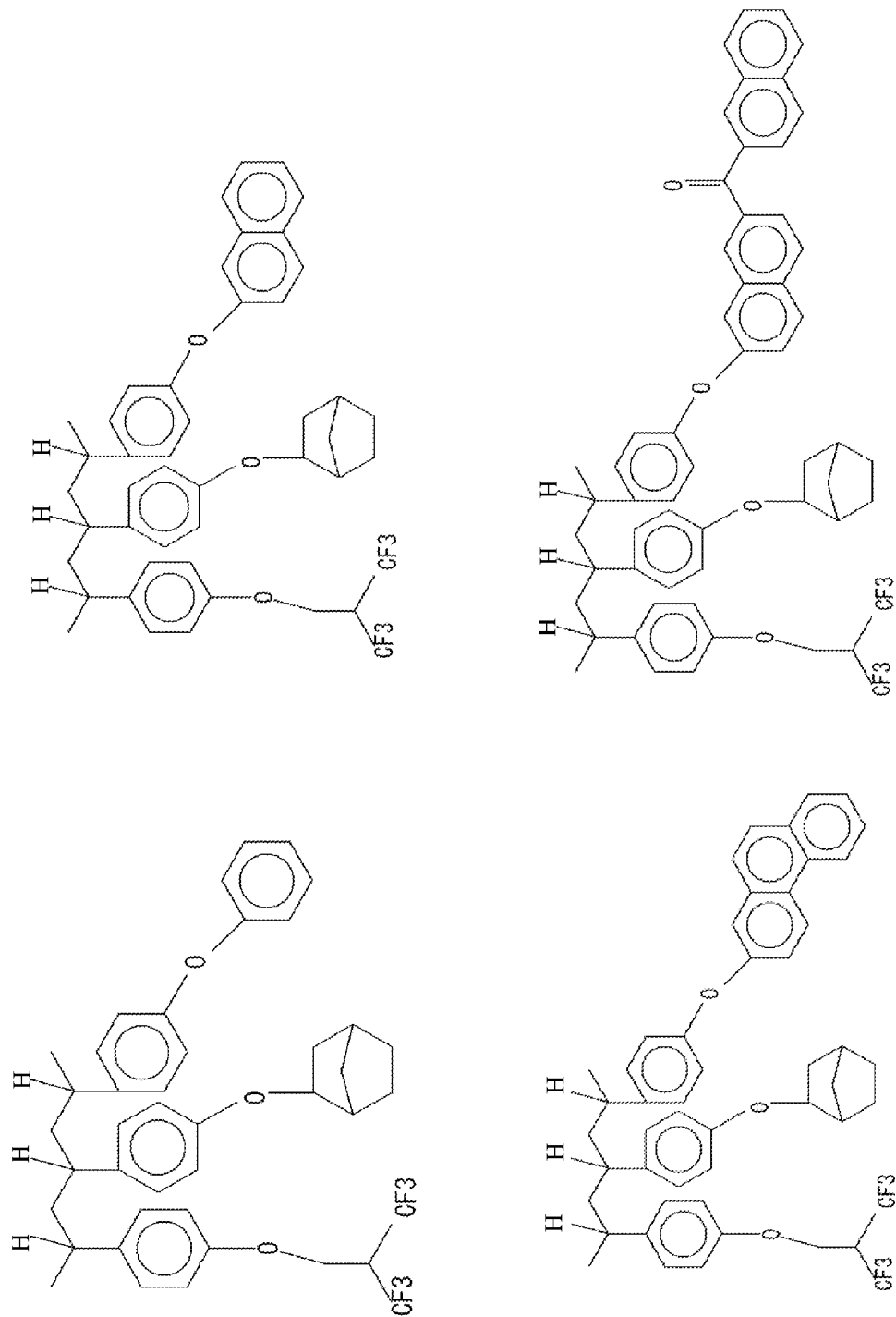

With reference to FIG. 8, the radiation-absorption control unit R2 has one of the following chemical formulas when A3=PhO— according to some embodiments:

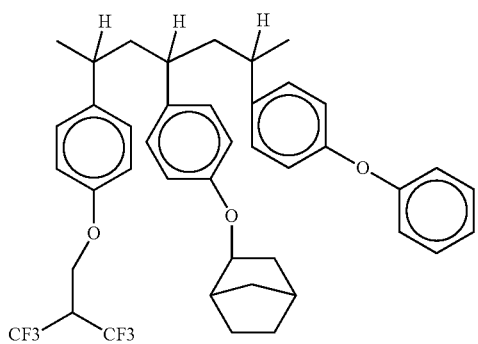

-continued

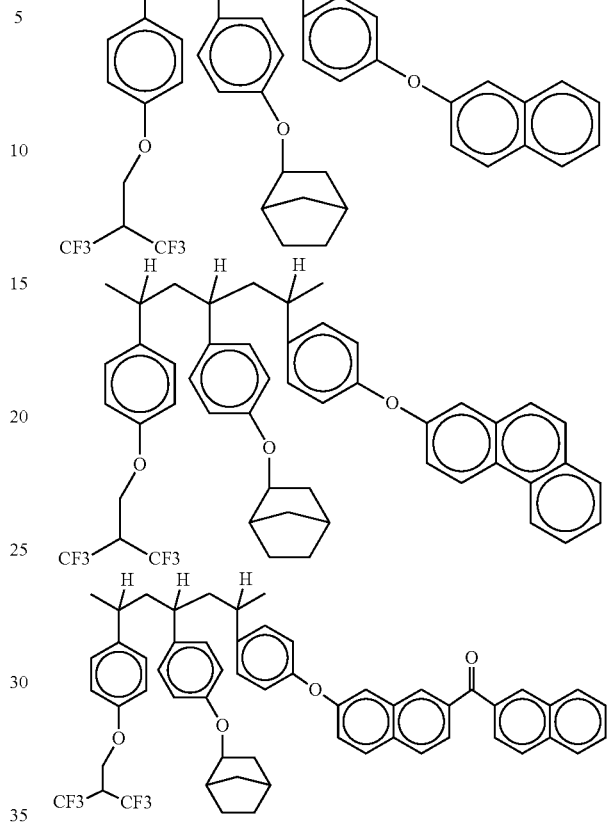

Referring now to FIG. 9, a spin drying and baking process 100 is performed to the semiconductor device 35. It is understood that in some embodiments, the process 100 may include two distinct steps: a step of spin drying, and a subsequent step of baking. For reasons of simplicity, however, the two steps are not separately illustrated herein. In the spin drying step, the substrate 40 and the layers formed thereon (including the photoresist material 60) are spin-dried. During the spin drying process, the additive 80 floats or rises toward the upper surface 90 of the photoresist material 60. This is due to the properties of the floating control unit Rf of the additive 80 discussed above. During the baking step, the solvent 70 has evaporated out of the photoresist material 60, and the additive 80 has risen to the upper surface 90 of the photoresist material 60.

The floating additive 80 effectively forms a protective layer at or near the upper surface 90 of the photoresist material 60. Due to the properties of the volume control unit of the additive 80 discussed above, the additive 80 can sufficiently block photoresist outgassing products. For example, referring now to FIG. 10, an exposure process 120 (which may include a post-exposure baking (PEB) step) is performed to the photoresist material 60 as a part of the EUV lithography process. The EUV lithography process may use a light source (or illumination source) that has a wavelength less than about 250 nm, for example about 13.5 nm. In some embodiments, the illumination source has at least one of: KrF, ArF, EUV, or E-beam. The light source exposes a predetermined region (corresponding to the opening 80) of the photoresist material 60, while other regions of the photoresist material 60 are protected through the use of a photomask (not illustrated).

The exposure process 120 (either the exposure itself or the PEB, or both) leads to the generation of various photoresist outgassing products 140, which as discussed above may be caused by PAG products, decomposition products from the PAG, or photochemical cleavage of protecting groups, among other things. The additive 80 is voluminous and dense enough so that the photoresist outgassing products 140 are trapped by the protective layer formed by the additive 80 (e.g., underneath the additive 80). As such, the outgassing products 140 cannot escape from the photoresist material 60, which reduces contamination of lithography equipment and improves lithography performance.

It is understood that this protective layer formed by the additive 80 is still within the photoresist material 60. As such, it does not add to the height of the photoresist material and will not adversely affect the aspect ratio of any subsequently formed photoresist patterns. In this manner, the present application is free of the issues that are associated with forming a separate top coating over the photoresist to prevent outgassing.

After the exposure process 120 is performed, subsequent lithography processes (e.g., developing, rinsing, etc.) may be performed to form a patterned photoresist (not illustrated herein for reasons of simplicity). Using the patterned photoresist as a mask, additional fabrication processes such as etching or implantation may be performed. Thereafter, the patterned photoresist may be removed by a photoresist removal process known in the art, such as a stripping or an ashing process.

Figure 11:
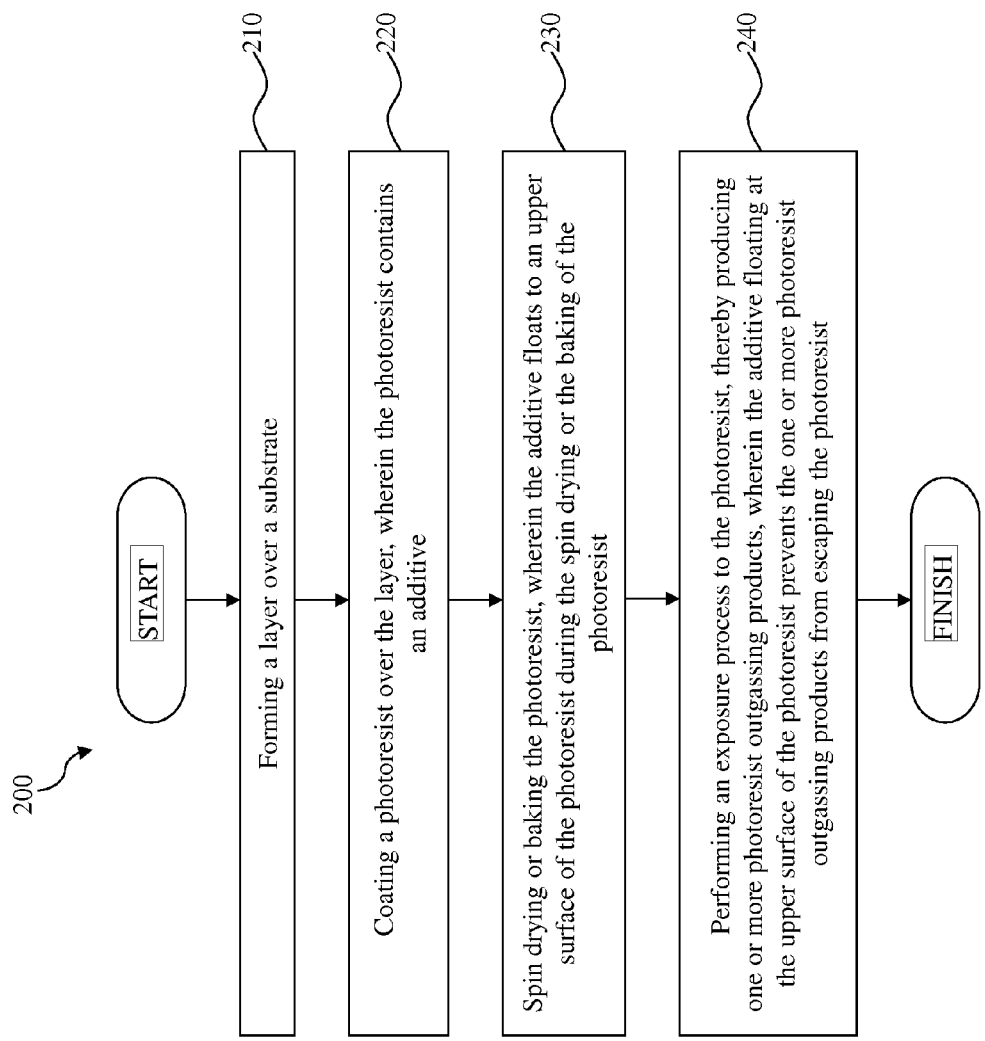
FIG. 11 is a flowchart illustrating a method of fabricating a semiconductor device in accordance with some embodiments of the present disclosure.

FIG. 11 is a flowchart of a method 200 of forming a semiconductor pattern according to various aspects of the present disclosure. The method 200 may be performed as a part of a lithography process, for example as a part of an extreme ultraviolet (EUV) lithography process in some embodiments.

The method 200 includes a step 210 of forming a layer over a substrate. In some embodiments, the substrate is substantially conductive or semi-conductive. The electrical resistance may be less than about $10^3$ ohm-meter. In some embodiments, the substrate contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 40 may contain Ti, Al, Co, Ru, TiN, $WN_2$, or TaN. In some other embodiments, the substrate contains a dielectric material with a dielectric constant in a range from about 1 to about 40. In some other embodiments, the substrate contains Si, metal oxide, or metal nitride, where the formula is MXb, wherein M is a metal or Si, and X is N or O, and wherein "b" is in a range from about 0.4 to 2.5. For example, the substrate may contain $SiO_2$, silicon nitride, aluminum oxide, hafnium oxide, or lanthanum oxide.

The layer formed over the substrate has different optical properties than photoresist. For example, the layer has a different n, k, or T value from photoresist. In some embodiments, the layer comprises at least one of different polymer structure, acid labile molecule, PAG (photo acid generator) loading, quencher loading, chromophore, cross linker, or solvent, which lead to different n value to photoresist. In some embodiments, the layer and photoresist have different etching resistance. In some embodiments, the layer contains an etching resistant molecule. The molecule includes low onishi number structure, double bond, triple bond, silicon, silicon nitride, Ti, TiN, Al, aluminum oxide, SiON, or combinations thereof.

The method 200 includes a step 220 of coating a photoresist over the layer. The photoresist contains an additive. In some embodiments, the additive contains a floating control unit configured to cause the additive to float toward the upper surface of the photoresist, as well as a volume control unit configured to block photoresist outgassing products. In some embodiments, the floating control unit contains fluorine or C1-C9 fluorine-containing alkyl group. In some embodiments, the volume control unit contains C5-C20 alkyl group, cycloalkyl group, hydroxylalkyl group, alkoxy group, alkoxyl alkyl group, acetyl group, acetylalkyl group, carboxyl group, alky carboxyl group, cycloalkyl carboxyl group, C5-C20 saturated or unsaturated hydrocarbon ring, or C5-C20 heterocyclic group.

In some embodiments, the additive further contains a radiation-absorption control unit configured to absorb radiation having a wavelength in a range from about 180 nanometers to about 250 nanometers. In some embodiments, the radiation-absorption control unit contains C5-C20 benzene, naphthalene, phenanthrene, or pentacenequinone derivatives.

The method 200 includes a step 230 of spin drying or baking the photoresist. The additive floats to an upper surface of the photoresist during the spin drying or the baking of the photoresist, thereby forming a protective layer at the upper surface of the photoresist.

The method 200 includes a step 240 of performing an exposure process to the photoresist, thereby producing one or more photoresist outgassing products. The exposure process may be performed as a part of an EUV lithography process and may include an exposure step and a post-exposure bake (PEB) step. The photoresist outgassing products may be produced during the exposure step and/or the PEB step. The additive floating at the upper surface of the photoresist prevents the one or more photoresist outgassing products from escaping the photoresist.

It is understood that additional processes may be performed before, during, or after the steps 210-240 of the method 200 to complete the fabrication of the semiconductor device. For example, the method 200 may include additional processes to pattern the photoresist, and then using the patterned photoresist as a mask for subsequent etching or ion implantation processes. As another example, the exposure process discussed herein may be done using a radiation having a first wavelength, and the photoresist may later be exposed by a radiation having a second wavelength (e.g., as a part of a double patterning process). For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the photoresist additive herein can effectively reduce photoresist outgassing. In more detail, the floating control unit of the additive allows the additive to float to the top surface of the photoresist during the spin drying and/or baking process. The volume control unit of the additive is sufficiently dense and voluminous so as to serve as a barrier for the photoresist outgassing products produced during a subsequent exposure process for EUV lithography. In other words, the photoresist outgassing products generated by EUV exposure will be trapped underneath the photoresist additive that floats at the top surface of the photoresist. Since the photoresist outgassing products are substantially trapped within the photoresist itself, the lithography tools will not be contaminated (photoresist outgassing products can contaminate lithography tools), and lithography performance will also be improved.

Another advantage is that the various aspects of the present disclosure can be implemented without increasing fabrication costs. The top coating is formed by the photoresist additive, rather than by an additional material external to the photoresist. Therefore, the material costs will remain more or less the same, since it is not expensive to implement the additive inside the photoresist. In addition, the formation of the top coating (made of the photoresist additive) does not require additional or separate fabrication processes. Instead, the standard fabrication process flow will cause the top coating to be formed, and thus the formation of the top coating herein does not increase fabrication costs in terms of fabrication equipment or fabrication processing time.

Yet another advantage is that since the top coating herein is formed "inside" the photoresist itself (at or near its top surface), it does not increase the height of the photoresist. This is beneficial since an increased photoresist height (if an external top coating is formed on top of the photoresist) would increase an aspect ratio and may lead to a worse process window and/or cause the patterned photoresist to collapse. In comparison, the photoresist herein has the same height as conventional photoresist without the additive. Therefore, there are no concerns regarding a worse processing window or photoresist collapsing.

One more advantage is that the additive herein can be optionally configured to absorb out-of-band (OOB) radiation in EUV. OOB radiation leads to degraded semiconductor lithography performance and is therefore undesirable. Here, the radiation-absorption control unit can absorb such OOB radiation, and as a result improve EUV lithography performance.

One embodiment of the present disclosure pertains to a method of fabricating a semiconductor device. A layer is formed over a substrate. A photoresist is coated over the layer. The photoresist contains an additive. The photoresist is spin-dried and/or baked. The additive floats to an upper surface of the photoresist during the spin drying or the baking of the photoresist. Thereafter, an exposure process is performed to the photoresist, thereby producing one or more photoresist outgassing products. The additive floating at the upper surface of the photoresist prevents the one or more photoresist outgassing products from escaping the photoresist.

Yet another embodiment of the present disclosure pertains to a method of fabricating a semiconductor device. A patternable layer is formed over a substrate. A photo-sensitive layer is formed over the patternable layer. The photo-sensitive layer contains an additive. The additive contains at least a floating control chemical and a volume control chemical. The photo-sensitive layer is spin-dried and/or baked. The floating control chemical allows the additive to rise upward during the spin drying or baking. Thereafter, as a part of an extreme ultraviolet (EUV) lithography process, the photo-sensitive layer is exposed. One or more outgassing chemicals are generated inside the photo-sensitive layer during the exposing. The volume control chemical is sufficiently voluminous and dense to trap the outgassing chemicals inside the photo-sensitive layer.

Another embodiment of the present disclosure pertains to a photoresist additive. The photoresist additive contains a floating control component that causes the photoresist additive to float toward an upper surface of a photoresist in which the photoresist additive is disposed. The photoresist additive also contains a volume control component having sufficient density and volume to block one or more photoresist outgassing products that are released during an exposure process. Optionally, the photoresist additive may also contain a radiation-absorption control component configured to absorb radiation having a wavelength in a range from about 180 nanometers to about 250 nanometers.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming a layer over a substrate;
   coating a photoresist over the layer, wherein the photoresist contains an additive and a solvent;
   spin drying the photoresist, wherein the additive floats to an upper surface of the photoresist during the spin drying;
   baking the photoresist after the spin drying, wherein the solvent evaporates out of the photoresist during the baking, thereby leaving the additive as a protective layer at or near the upper surface of the photoresist; and
   performing, after the baking, an extreme ultraviolet (EUV) lithography exposure process to the photoresist, the exposure process producing one or more photoresist outgassing products, wherein the additive at the upper surface of the photoresist prevents the one or more photoresist outgassing products from escaping the photoresist; and
   developing the photoresist after the performing of the exposure process.

2. The method of claim 1, wherein the additive comprises a floating control unit and a volume control unit, and wherein:
   the floating control units causes the additive to float toward the upper surface of the photoresist during the spin drying or the baking of the photoresist; and
   the volume control unit blocks the one or more photoresist outgassing products during the exposure process.

3. The method of claim 2, wherein:
   the floating control unit comprises fluorine or C1-C9 fluorine-containing alkyl group; and
   the volume control unit comprises C5-C20 alkyl group, cycloalkyl group, hydroxylalkyl group, alkoxy group, alkoxyl alkyl group, acetyl group, acetylalkyl group, carboxyl group, alky carboxyl group, cycloalkyl carboxyl group, C5-C20 saturated or unsaturated hydrocarbon ring, or C5-C20 heterocyclic group.

4. The method of claim 2, wherein the additive further comprises a radiation-absorption control unit, and wherein the radiation-absorption control unit absorbs radiation having a wavelength in a range from about 180 nanometers to about 250 nanometers during the exposure process.

5. The method of claim 4, wherein the radiation-absorption control unit comprises C5-C20 benzene, naphthalene, phenanthrene, or pentacenequinone derivatives.

6. The method of claim 1, wherein the additive has a greater density than a rest of the photoresist.

7. The method of claim 1, wherein the one or more photoresist outgassing products comprise a tertbutylbenzene outgassed by a photo acid generator (PAG) during acid generation or an isobutene outgassed by a polymer during a deprotection reaction.

8. A method of fabricating a semiconductor device, comprising:
forming a patternable layer over a substrate;
forming a photo-sensitive layer over the patternable layer, wherein the photo-sensitive layer contains an additive and a solvent, wherein the additive comprises at least a floating control chemical and a volume control chemical, the volume control chemical causing the additive to have a greater density than a rest of the photo-sensitive layer;
spin drying the photo-sensitive layer, wherein the floating control chemical allows the additive to rise upward during the spin drying;
baking the photo-sensitive layer after the spin drying, wherein the solvent evaporates out of the photo-sensitive layer during the baking, thereby leaving the additive as a protective layer at or near an upper surface of the photo-sensitive layer;
exposing, after the baking and as a part of an extreme ultraviolet (EUV) lithography process, the photo-sensitive layer, wherein one or more outgassing chemicals are generated inside the photo-sensitive layer during the exposing, and wherein the volume control chemical traps the outgassing chemicals inside the photo-sensitive layer during the exposing; and
developing the photo-sensitive layer after the exposing.

9. The method of claim 8, wherein:
the floating control chemical comprises fluorine or C1-C9 fluorine-containing alkyl group; and
the volume control chemical comprises C5-C20 alkyl group, cycloalkyl group, hydroxylalkyl group, alkoxy group, alkoxyl alkyl group, acetyl group, acetylalkyl group, carboxyl group, alky carboxyl group, cycloalkyl carboxyl group, C5-C20 saturated or unsaturated hydrocarbon ring, or C5-C20 heterocyclic group.

10. The method of claim 8, wherein the additive further comprises a radiation-absorption control chemical configured to absorb radiation having a wavelength in a range from about 180 nanometers to about 250 nanometers.

11. The method of claim 10, wherein the radiation-absorption control chemical comprises C5-C20 benzene, naphthalene, phenanthrene, or pentacenequinone derivatives.

12. The method of claim 8, wherein before the exposing, the additive forms a coating at a top surface of the photo-sensitive layer as a result of the floating control chemical allowing the additive to rise upward.

13. The method of claim 8, wherein the additive has a greater density than the rest of the photo-sensitive layer and has a molecular weight in a range from about 1000 to about 25000.

14. A photoresist, comprising:
a solvent; and
an additive that includes a polymer:
wherein the polymer has one of the following chemical formulas:

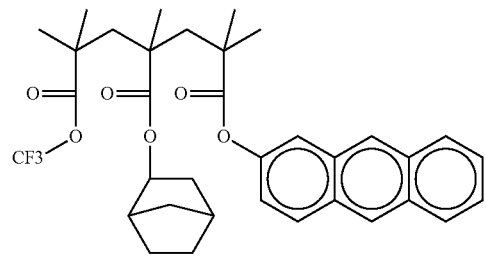

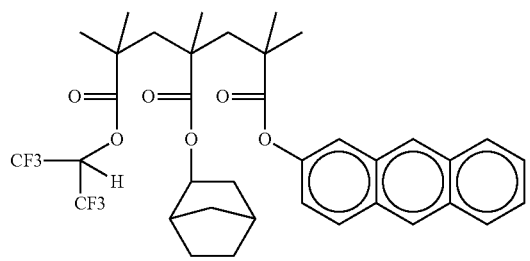

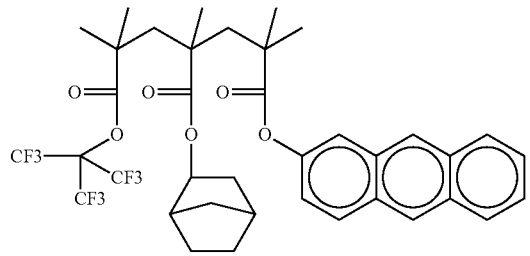

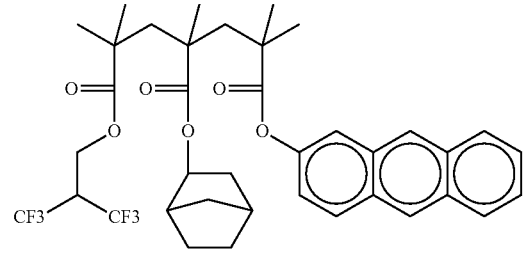

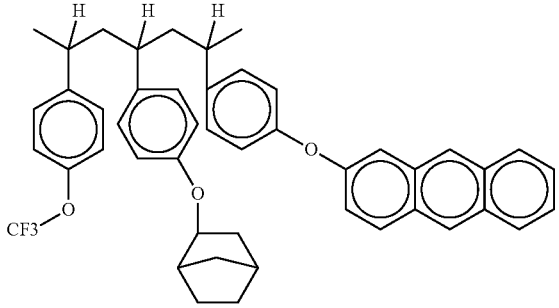

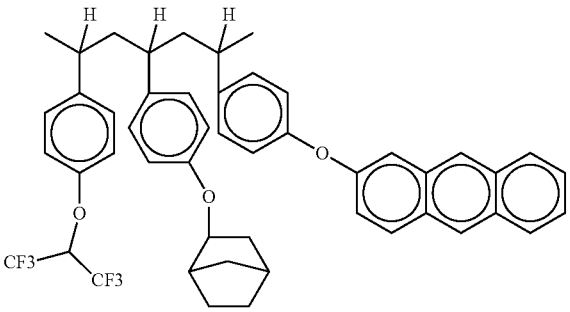

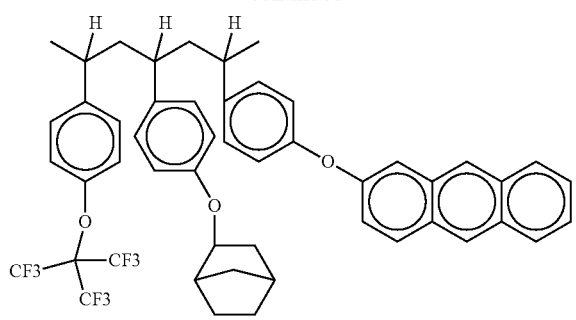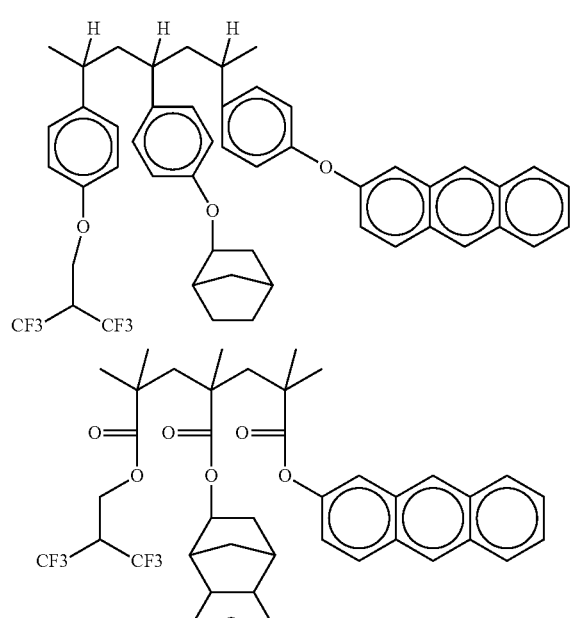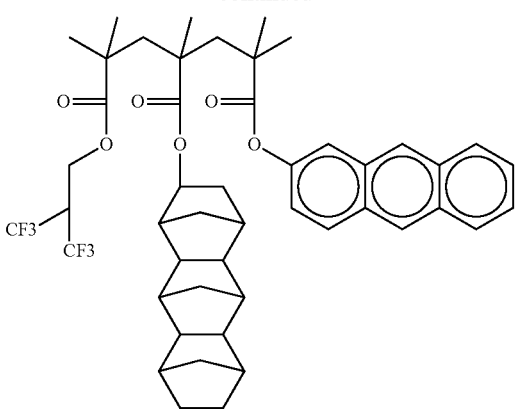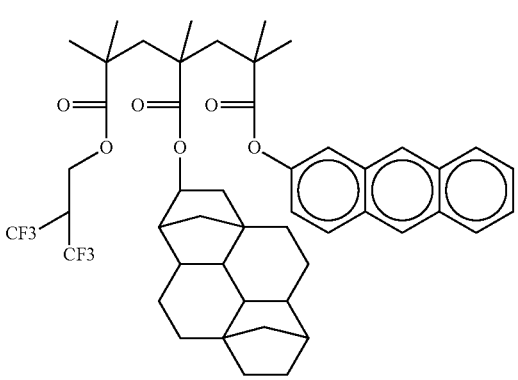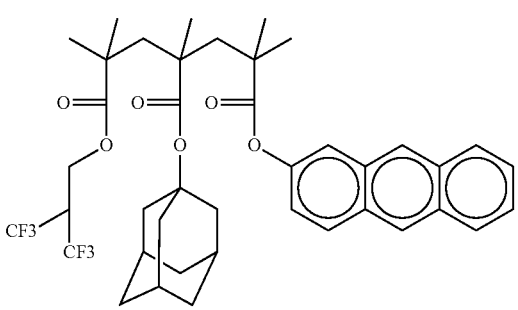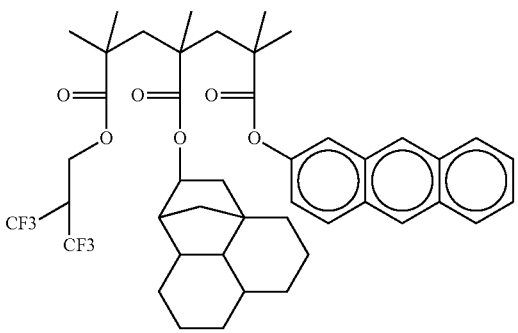

21
-continued
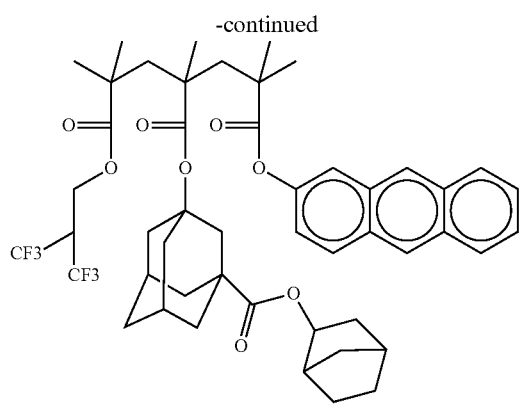
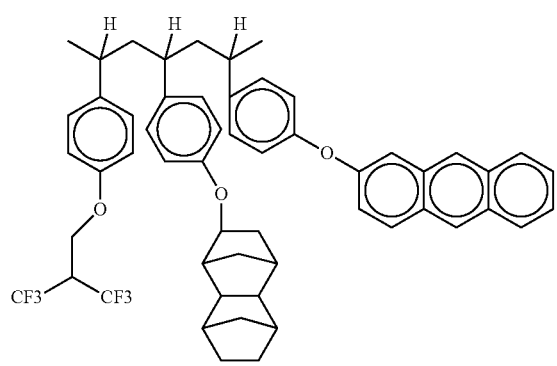
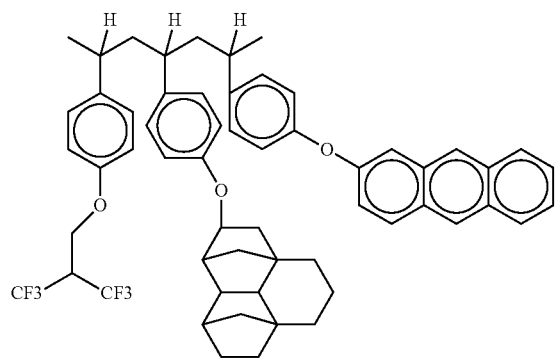
22
-continued
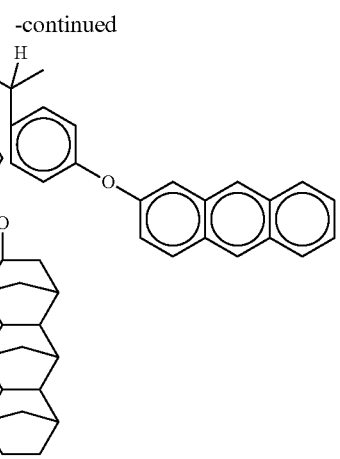
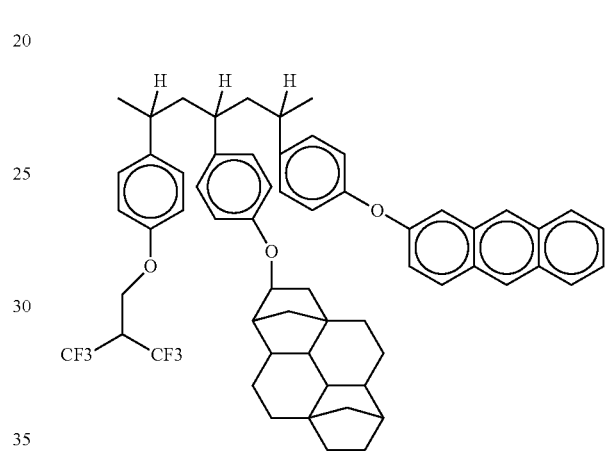
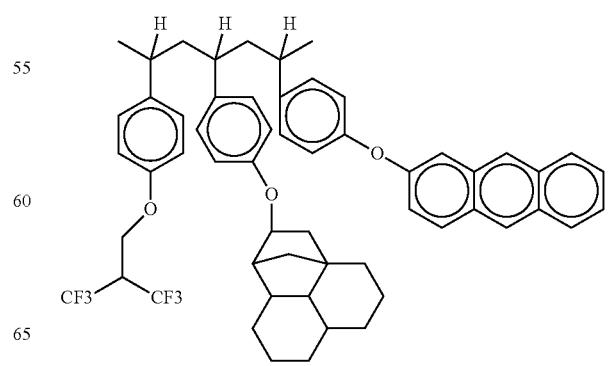

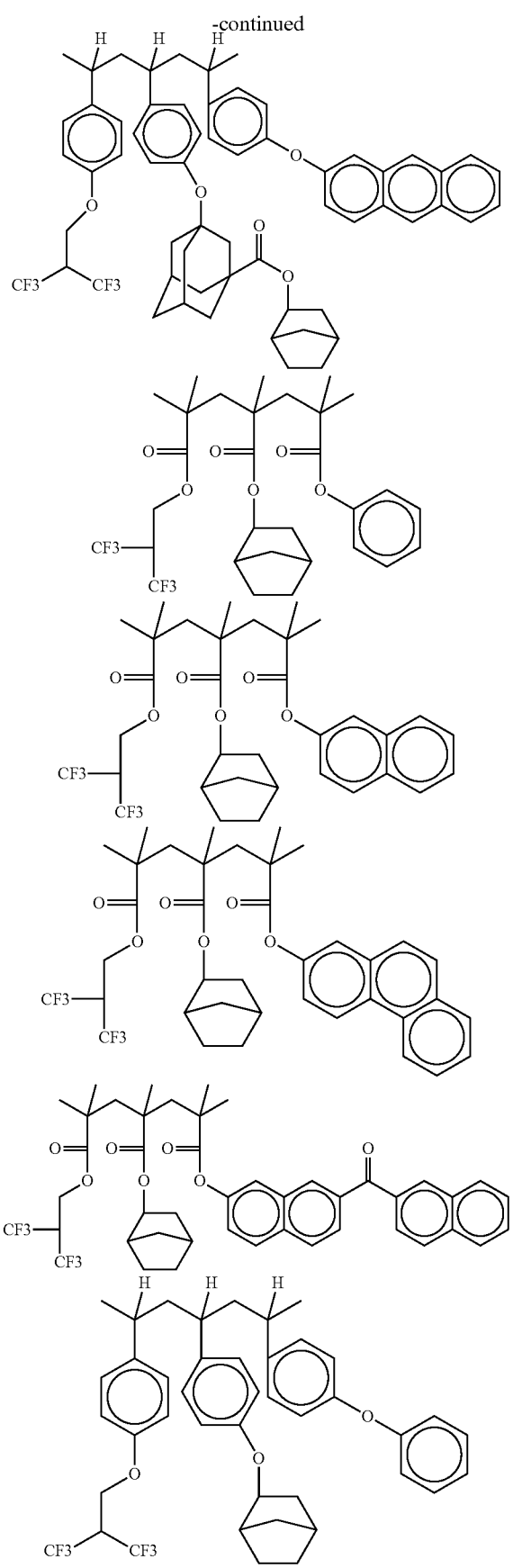

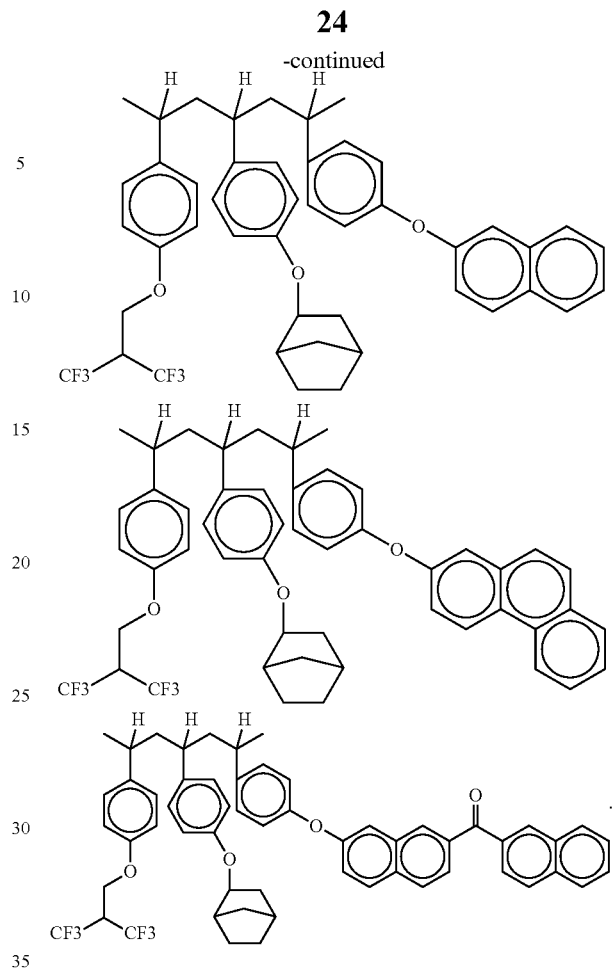

15. The photoresist of claim 14, wherein:
the polymer includes a volume control component that is denser than a rest of the photoresist such that the additive traps one or more photoresist outgassing products within the photoresist, the one or more photoresist outgassing products comprising chemicals that are released during an extreme ultraviolet (EUV) lithography exposure process.

16. The photoresist of claim 14, wherein the polymer includes a radiation-absorption control component configured to absorb radiation having a wavelength in a range from about 180 nanometers to about 250 nanometers.

17. The photoresist of claim 16, wherein the radiation-absorption control component comprises naphthalene, phenanthrene, or pentacenequinone derivatives.

18. The photoresist of claim 14, wherein the additive has a molecular weight in a range from about 1000 to about 25000.

19. The photoresist of claim 15, wherein less than about 50% of the additive is the volume control component.

20. The photoresist of claim 16, wherein the polymer includes a floating control component that causes the additive to float toward an upper surface of a photoresist in which the additive is disposed wherein the floating control component comprises fluorine or a fluorine derivative in a concentration of 10 to 80% in the additive.

* * * * *